United States Patent
Allan et al.

(10) Patent No.: US 12,191,793 B2
(45) Date of Patent: Jan. 7, 2025

(54) AIRFLOW HEALTH PREDICTIVE MAINTENANCE FOR MOTOR DRIVES

(71) Applicant: Rockwell Automation Technologies, Inc., Mayfield Heights, OH (US)

(72) Inventors: John David Allan, Kitchener (CA); Tahsina Hossain, Cambridge (CA); Garron K. Morris, Whitefish Bay, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 86 days.

(21) Appl. No.: 17/954,064

(22) Filed: Sep. 27, 2022

(65) Prior Publication Data
US 2024/0106382 A1    Mar. 28, 2024

(51) Int. Cl.
*H02P 31/00*    (2006.01)

(52) U.S. Cl.
CPC .................. *H02P 31/00* (2013.01)

(58) Field of Classification Search
CPC ......... H02P 31/00; H02K 9/26; B01D 46/446; B01D 46/0086
See application file for complete search history.

(56) References Cited

U.S. PATENT DOCUMENTS

| | | | |
|---|---|---|---|
| 6,837,922 B2 * | 1/2005 | Gorin ................. | B01D 46/0086 210/90 |
| 7,244,294 B2 * | 7/2007 | Kates ................. | G05D 23/1932 96/417 |
| 7,261,762 B2 * | 8/2007 | Kang ................. | B01D 46/0086 116/DIG. 25 |
| 7,640,761 B2 * | 1/2010 | Garrett ..................... | F24F 11/77 700/282 |

(Continued)

OTHER PUBLICATIONS

VFDs on Process Fans—When Are They a Good or a Bad Idea?, Kevin Grotheer and Bryan Cook, published in *2022 IEEE-IAS/PCA Cement Industry Conference (IAS/PCA)*.

(Continued)

*Primary Examiner* — Rina I Duda

(57) ABSTRACT

An airflow health predictive maintenance system and method for a motor drive includes a differential pressure sensor that senses an air pressure differential between a sensing location within an enclosed cabinet space of the motor drive and a reference location. The system includes an electronic control system configured to select a setpoint that indicates that airflow through the cabinet space has reached a value associated with a need for air filter maintenance. The control system is further configured to obtain air pressure differential measurements periodically from the differential pressure sensor and generate an actual trend comprising a series of values, wherein each of the values of the actual trend is derived from one or more of the air pressure (Continued)

differential measurements. The control system is also configured to project the actual trend to derive a projected trend based upon the series of values of the actual trend and compare the projected trend to the setpoint to predict an end of life event that can be used to determine a time when air filter maintenance is predicted to be required, wherein the end of life event is based upon a predicted intersection of projected trend with the setpoint.

20 Claims, 5 Drawing Sheets

(56) References Cited

U.S. PATENT DOCUMENTS

| | | |
|---|---|---|
| 9,092,030 B2 | 7/2015 | Weiss et al. |
| 9,183,723 B2* | 11/2015 | Sherman ............... F24F 11/526 |
| 10,065,143 B2* | 9/2018 | Beier ................... B01D 46/429 |
| 10,258,915 B2* | 4/2019 | Gruenbacher ..... B01D 46/0016 |
| 10,309,677 B2* | 6/2019 | Abiprojo ................ F24F 11/58 |
| 10,553,464 B2 | 2/2020 | Jeong et al. |
| 2019/0204203 A1 | 7/2019 | Nix |
| 2019/0262756 A1* | 8/2019 | Arthur .................. G01L 19/086 |
| 2020/0256578 A1* | 8/2020 | Meis ................... B01D 46/446 |

OTHER PUBLICATIONS

Extended Search Report, dated Feb. 15, 2024 in connection with EP Appln. No. 23187402.5.

* cited by examiner

AIRFLOW HEALTH PREDICTIVE MAINTENANCE FOR MOTOR DRIVES

BACKGROUND INFORMATION

Motor drives are power conversion systems or "converters" that operate to provide power to electric motors in a controlled fashion to control one or more motor performance parameters, such as speed and torque. Often referred to as Variable Frequency Drives (VFD), such motor drives typically receive multiphase AC input power which is converted by a rectifier to DC power supplied to a DC link and provided from the DC link to an inverter in a current source drive. The inverter switches the DC link currents to provide AC output current to a motor load, with the output current being controlled by the inverter in closed loop fashion to drive the motor at a desired speed and/or torque. DC power can also be supplied directly to a load from the DC link. The rectifier is generally an active switching type rectifier that selectively activates switches to provide current from the AC input to the DC link bus to achieve AC to DC power conversion. The inverter, in turn, implements a switching scheme to selectively connect the motor leads to the DC link bus terminals to provide motor phase currents with controlled amplitudes, phase, and frequency to implement a particular motor control strategy based on motor performance feedback values and desired performance setpoints or profiles. Voltage source drives are similar, but the DC link supplies a select constant DC voltage rather than a select constant DC current.

The rectifier and inverter switches are solid state switch devices such as, e.g., gate turnoff thyristors (GTOs), silicon-controlled rectifiers (SCRs), insulated gate bipolar transistors (IGBTs), symmetrical gate commutated thyristors (SCGTs), or the like. Regardless of the exact type of motor drive and switches implemented, the switches generate large amounts of heat that must be dissipated. As the power output ratings of motor drives increase, the need for reliable cooling systems becomes increasingly critical. These cooling systems often rely upon establishing airflow through the motor drive to cool the switches and other components. As such, it is important to ensure that the quality (volume) of the airflow meets minimum requirements over time.

Commonly assigned U.S. Pat. No. 9,092,030 entitled "Method to Implement Drive Diagnostics and Prognostics Automatically," the entire disclosure of which is hereby expressly incorporated by reference into the present specification, provides an example of a motor drive that relies upon expected temperature rise models to determine airflow health. The patent discloses a method for determining a drive prognostic and/or diagnostic based upon the sensed ambient temperature in the region of an air inlet of a fan.

When a motor drive uses a forced air cooling system including air filters, the need to keep the air filters clean and the fan(s) operating within specifications is one of the main factors needed to maintain the required airflow to cool the switches and other power components of the drive. On larger drives, the number of air filters that need to be changed when clogged is considerable. Current methods rely on a fixed filter replacement schedule that may not accurately reflect actual operating conditions, especially when such operating conditions often change over time. Accordingly, a need has been identified for a system and method for predicting air filter maintenance schedules for a motor drive forced air cooling system to ensure that the motor drive operates within the manufacturers specified operating parameters at all times.

BRIEF DESCRIPTION

In accordance with one aspect of the present development, an airflow health predictive maintenance system for a motor drive includes a differential pressure sensor that senses an air pressure differential between a sensing location within an enclosed cabinet space of the motor drive and a reference location. The system includes an electronic control system configured to select a setpoint that indicates that airflow through the cabinet space has reached a value associated with a need for air filter maintenance. The control system is further configured to obtain air pressure differential measurements periodically from the differential pressure sensor and generate an actual trend comprising a series of values, wherein each of the values of the actual trend is derived from one or more of the air pressure differential measurements. The control system is also configured to project the actual trend to derive a projected trend based upon the series of values of the actual trend and compare the projected trend to the setpoint to predict an end of life event that would be used to determine a time when air filter maintenance is predicted to be required, wherein the end of life event is based upon a predicted intersection of the projected trend with the setpoint.

In accordance with another aspect of the present development, a method for airflow health predictive maintenance for a motor drive includes operating a fan to induce airflow through an enclosed space of a cabinet of the motor drive, wherein said airflow enters the enclosed space through at least one air filter. An air pressure differential created by the fan is measured between a sensing location in communication with the enclosed space and a reference location to obtain an air pressure differential measurement. The method includes at least one of: (i) comparing the air pressure differential measurement to an air pressure differential setpoint and predicting when maintenance of the at least one air filter will be required; (ii) deriving a volume of the airflow based upon the air pressure differential measurement and comparing the volume of the airflow to an airflow volume setpoint to predict when maintenance of said at least one air filter will be required.

DETAILED DESCRIPTION

Figure 1:
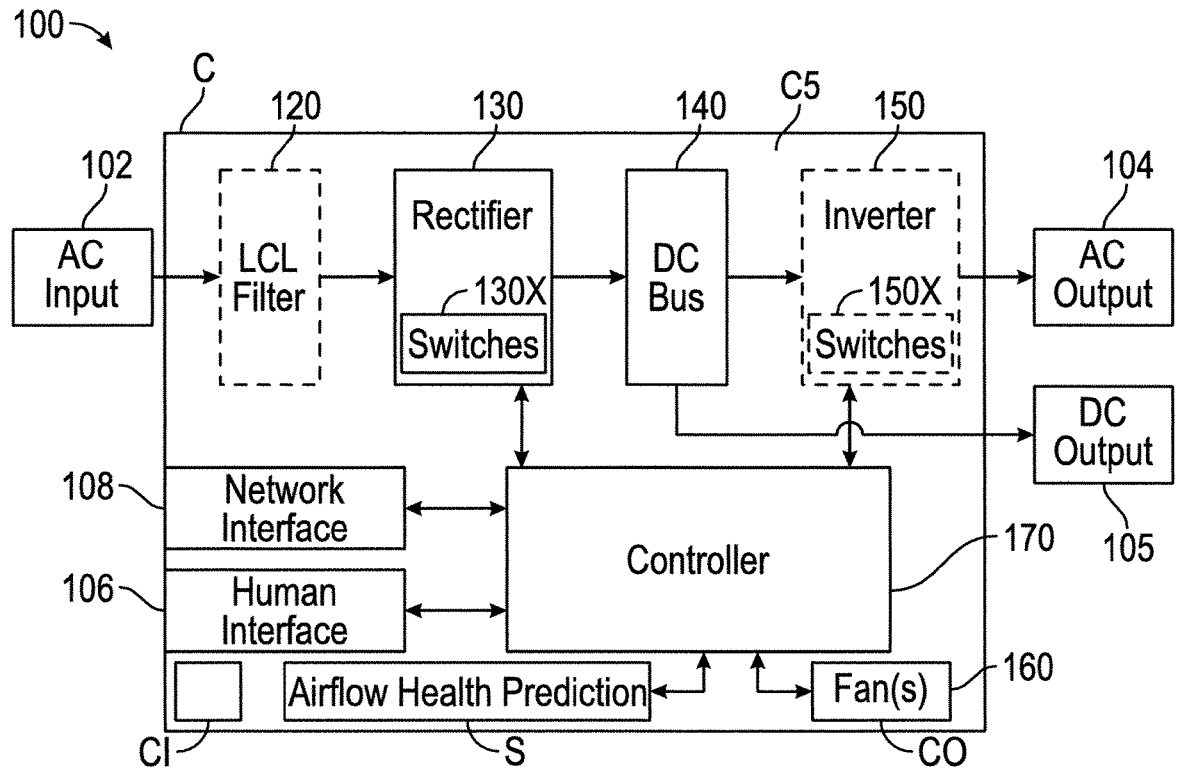
FIG. 1 illustrates one example of an electrical motor drive power conversion system (a "motor drive") including an airflow health predictive maintenance system and method in accordance with an embodiment of the present development.
Figure 2:
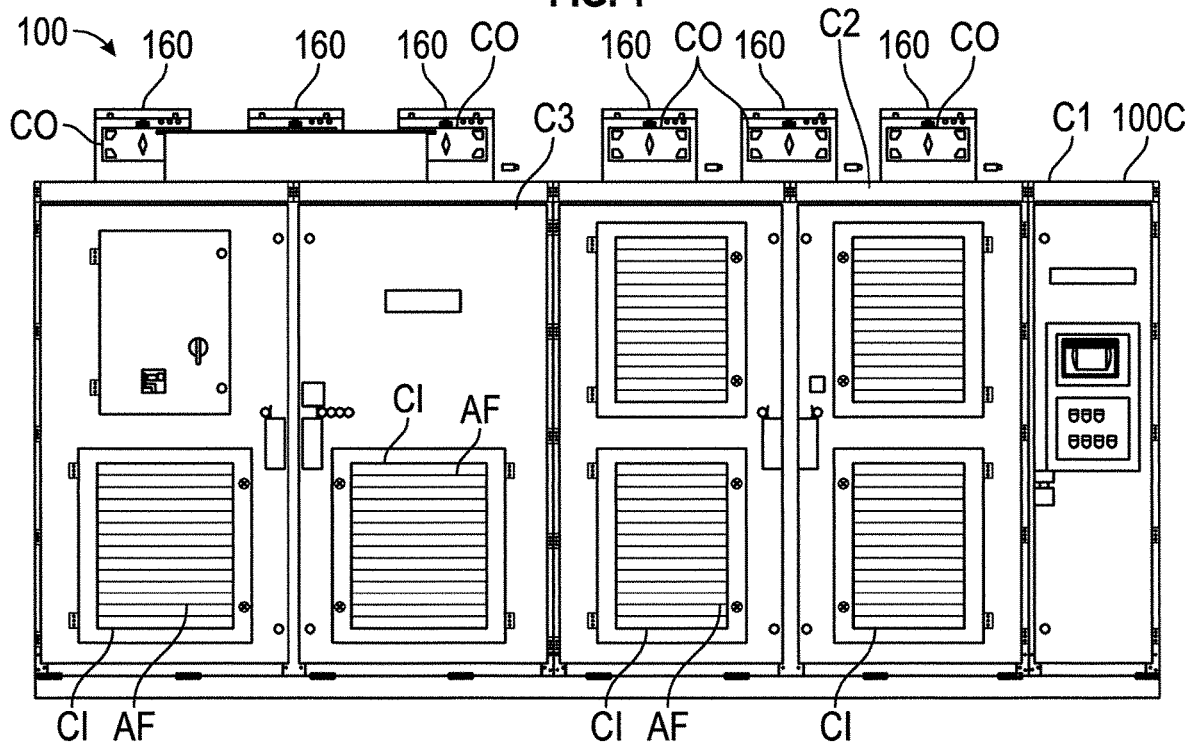
FIG. 2 is a front elevation view of a motor drive power conversion system such as the system shown in FIG. 1 or another motor drive system, as contained within multiple interconnected enclosures or cabinets.

FIGS. 1 & 2 illustrate one example of an electrical motor drive power conversion system 100 (also referred to as a "motor drive") for converting input electrical power such as single or multiphase AC power from a grid or other source 102 into output electrical AC power 104 for a motor or other load such that the output power has the required voltage, current, frequency, and/or phase to drive the load at the desired effect. A DC power output 105 can also be provided. The motor drive 100 is housed within one or more sheet metal or other enclosures or cabinets C that contain multiple printed circuit board assemblies (PCBA) and other components that include the required switches and other electrical devices and circuits for operation of the motor drive 100 as described below.

The example motor drive 100 of FIG. 1 includes a rectifier 130 connected to an output inverter 150 through a DC bus circuit or "link" 140. The rectifier 130 includes multiple rectifier switches 130X for rectifying the AC input power 102 and supplying same to the DC bus 140. A power conditioning circuit such as an LCL filter circuit 120 can be connected between the input power 102 and the rectifier 130. The inverter 150 includes multiple inverter switches 150X for inverting the DC bus voltage to the desired AC output power 104. The rectifier switches 130X and the inverter switches 150X can each be gate turnoff thyristors (GTOs), silicon-controlled rectifiers (SCRs), insulated gate bipolar transistors (IGBTs), symmetrical gate commutated thyristors (SCGTs), or other suitable semiconductor switches. The motor drive 100 can be a current source drive or a voltage source drive. In one non-limiting example, a voltage source drive can comprise a cascaded H-Bridge multi-level inverter, but other switching methods can be used.

One or more fans 160 are provided inside or external to the cabinet C for drawing ambient air into and circulating the air inside and through the cabinet C for cooling the switches 130X,150X and other electrical components of the motor drive 100. The motor drive 100 further comprises an electronic control system or controller 170 including one or more microprocessors, microcontrollers, storage devices, random access memory devices, input/output devices and the like as required for the control system 170 to control the fan(s) 160, switches 130X,150X, and all other components of the motor drive 100 based upon executed software, firmware, logic and other control instructions and also based upon feedback signals received from the voltage or current of the output power 104, from the motor or other load being driven, or from other sources. The control system 170 is also connected to one or more Human/Machine Interface (HMI) devices 106 such one or more keyboards, visual display screens, audio devices, touch screens, or other human input/output devices. The control system 170 is also connected to one or more wired or wireless network interface devices 108 such as network ports, fiber optic transceivers, wireless transceivers, and the like for transmitting data to and receiving data from one or more connected systems.

FIG. 2 provides a front elevation view of a motor drive system such as the system 100 described above. As shown in FIG. 2, multiple cabinets C1,C2,C3 are located adjacent each other and interconnected to define the overall enclosure C. Each cabinet C can, itself, include multiple cabinets or sub-enclosures. In one example, the cabinet C1 is a control cabinet housing the controller 170, and the cabinets C2 and C3 are power cell cabinets, transformer cabinets, filter cabinets, or any other cabinet that houses the switches 130X,150X, transformers, and other power components of the motor drive 100 and that utilize forced air cooling. At least some of the cabinets C (such a C2 & C3 in the illustrated embodiment) include one or more fans 160 connected thereto such as on a top wall or elsewhere for implementing a forced-air cooling system for drawing ambient air into the cabinet C and its interior space CS via air inlets CI that are formed by openings defined in the cabinet C such as in the walls or doors of the enclosure, circulating the air inside and through the enclosed space CS for cooling the switches 130X,150X and other electrical components of the motor drive 100 located in the enclosed space CS, and for exhausting the air through air outlets CO. The air inlets CI include air filters AF located in covering relation with the air inlets CI for filtering dust, debris, and other contaminants from the surrounding or ambient air drawn into the cabinet space CS via air inlets CI. Although each cabinet C with forced-air cooling can utilize only a single fan 160, it is common, as shown herein, for two or more fans 160 to be used for each enclosure C that implements forced-air cooling to provide for increased airflow and redundancy.

Figure 3:
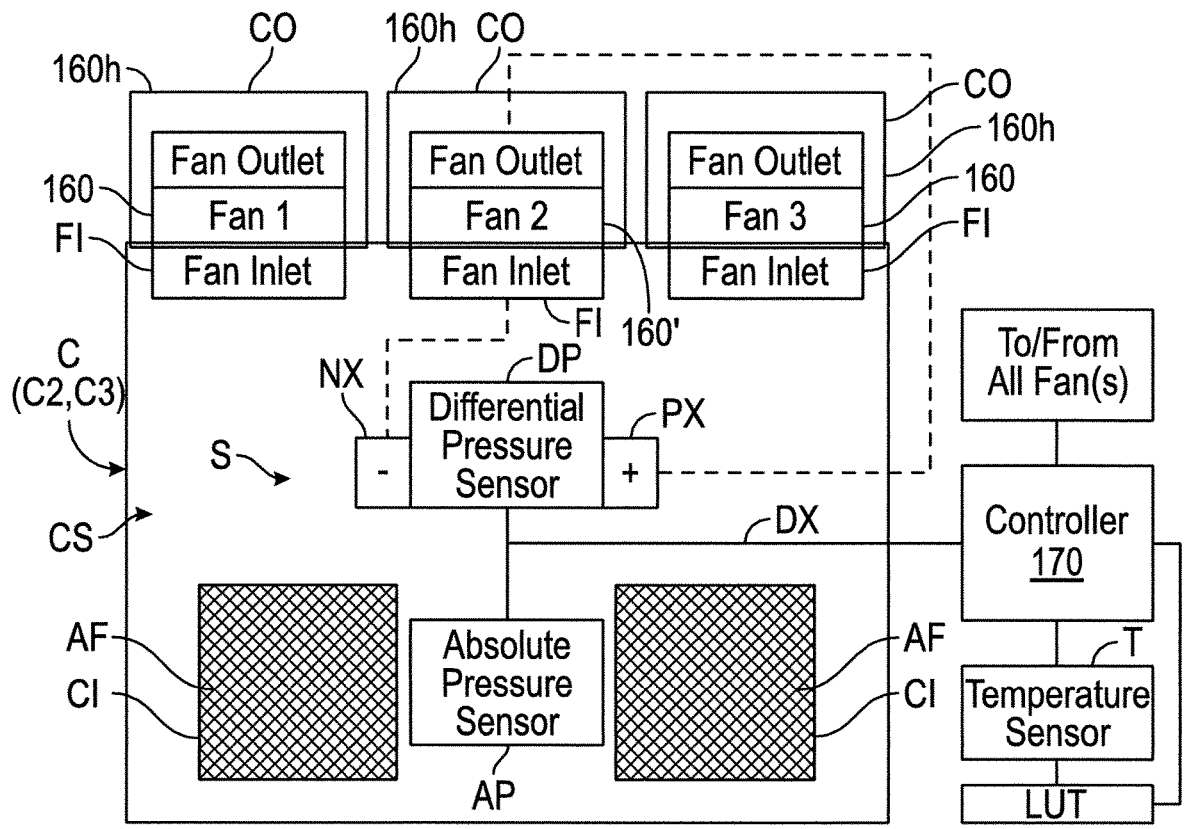
FIG. 3 illustrates one of the cabinets of FIG. 2 that implements an airflow health predictive maintenance system and method in accordance with an embodiment of the present development.

FIG. 3 diagrammatically illustrates the cabinet C2 or C3 where it can be seen that each fan 160 comprises a fan hood 160h that contains the fan 160. The fan hood 160h is connected to the cabinet C. Each fan hood 160h comprises a fan inlet FI by which air is drawn into the fan 160 and a fan outlet FO by which air is exhausted by the fan 160. Each fan inlet FI is in fluid communication with the interior space CS of the cabinet C, typically near an upper portion thereof, and each fan outlet FO typically is in fluid communication with the air outlet CO which can be part of the fan hood 160h. When the fan 160 is operated to induce airflow from the fan inlet FI to the fan outlet FO, an air pressure differential is established between the fan inlet FI (and the cabinet internal space CS) and the fan outlet FO which may or may not equal the ambient atmosphere outside the cabinet C (C2,C3), with lower air pressure located at the fan inlet FI as compared to the fan outlet FO. The air pressure differential established by the fan 160 causes ambient air to be drawn into the cabinet space CS through the air inlet(s) CI, flow through the cabinet space CS for cooling, flow across the fan 160 from the fan inlet FI to the fan outlet FO and be exhausted through the air outlet(s) CO so as to provide a cooling airflow through the cabinet space CS.

With continuing reference to FIG. 3, at least one of the enclosure cabinets C (C2,C3) with forced-air cooling, and optionally multiple or all enclosure cabinets C (C2,C3) with forced-air cooling, includes and implements an airflow health predictive maintenance system S according to the present development as described herein. In the case where two or more cabinets C each implement an airflow health predictive maintenance system S, each such system S will operate independently of any other system S. The system S comprises a differential pressure sensor DP for sensing an air pressure difference or differential between a sensing location within the enclosed space CS of the cabinet C (e.g., in a central region of the space CS or in or otherwise adjacent the fan inlet FI) and a reference location such as the ambient atmosphere external to the cabinet C or in or otherwise adjacent a fan outlet FO. The differential pressure sensor DP can be located in the cabinet space CS for which the differential pressure is being measured or can be remotely located outside of the cabinet space CS with its negative and positive ports fluidically connected to the desired sensing and reference locations such as a sensing location within the internal cabinet space CS and a reference location such as the ambient atmosphere, respectively, using tubing or the like. The sensed pressure differential as measured by the differential pressure sensor DP corresponds to and can represent the vacuum pressure established within the enclosed cabinet space CS due to operation of the fan(s) 160. In the illustrated example, the differential pressure sensor DP includes a negative (−) pressure port NX and a positive (+) pressure port PX. The differential pressure sensor DP senses an air pressure difference between the positive and negative ports PX,NX and outputs an electrical output signal DX having a voltage magnitude that is proportional to the magnitude of the sensed pressure differential between the positive and negative ports PX,NX such that the magnitude of the output signal DX varies as the magnitude sensed differential pressure varies. The pressure differential sensor DP is operatively connected to the motor drive controller 170 such that the controller 170 actively monitors the air pressure differential signal DX and periodically derives an air pressure differential measurement from the pressure differential signal DX and uses the measurement as described below to implement the airflow health predictive maintenance system and method of the present development as described herein.

FIG. 3 also shows that the system S can include an absolute pressure sensor AP that senses the absolute atmospheric air pressure where the motor drive 100 is located. The absolute pressure sensor can be located inside (as shown) or outside the cabinet space CS, but in each case measures the natural or unaffected atmospheric pressure of the ambient atmosphere surrounding the motor drive 100. The absolute air pressure sensed by the absolute pressure sensor can be used by the controller 170 to derive an altitude at which the drive is located, which can be used as described below. As an alternative to using an absolute pressure sensor, the actual altitude, geographic region, and/or other information can be input to the controller 170 using the HMI 106 and/or network interface 108 or otherwise and used by the controller 170 as an altitude parameter (if altitude is input directly) and/or to derive an altitude parameter (if geographic or indirect altitude data is entered).

The system S can further comprise a temperature sensor T for sensing the temperature of the ambient atmosphere externally surrounding the cabinet C outside the cabinet space CS. The temperature sensor T is operatively connected to and provides a signal to the controller 170 that represents the sensed temperature. The temperature sensor T can additionally or alternatively be configured to sense the temperature of the air inside the cabinet space CS, such as the temperature of the air entering at least one of the fan inlets FI, for input to the controller 170.

Figure 4:
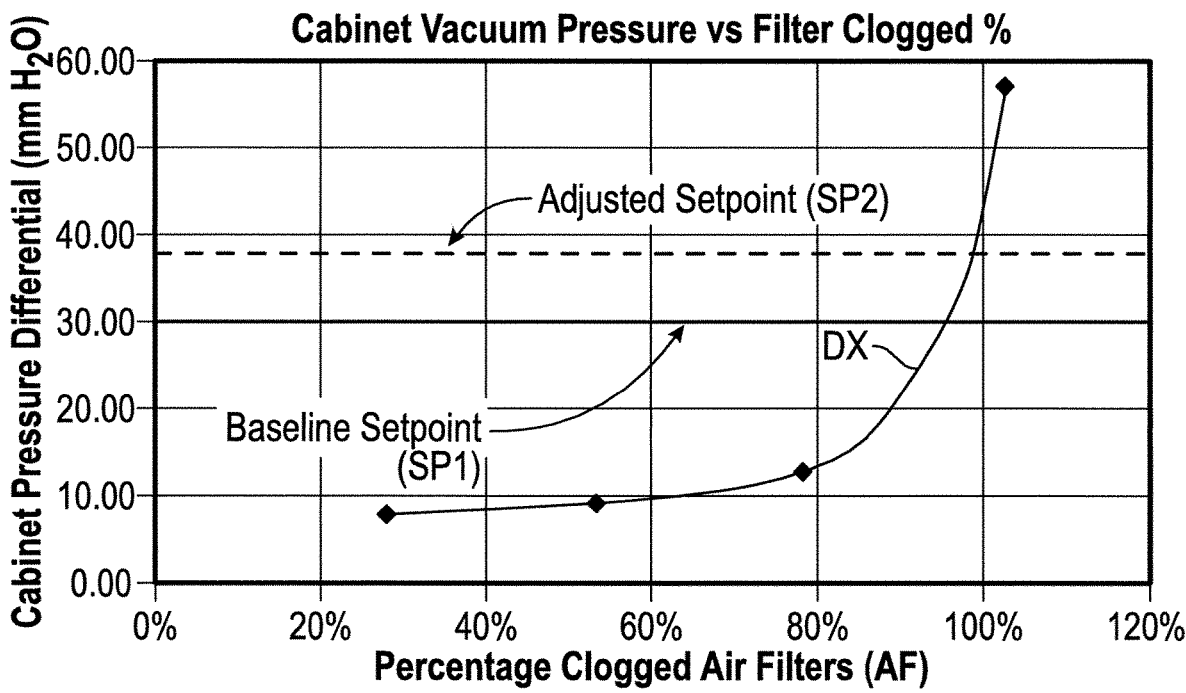
FIG. 4 is a graph that illustrates cabinet pressure differential (vacuum) pressure vs. air filter clogging.

As shown in FIG. 4, as the air filter(s) AF of the enclosure cabinet C become clogged with dust and other contaminants, the air pressure differential between the enclosed cabinet space CS and the external ambient atmosphere increases as the airflow through the filters AF becomes increasingly restricted. The relationship between the percentage of clogging of the enclosure inlet air filter(s) AF on the X-axis and the pressure differential as measured by the differential pressure sensor DP on the Y-axis (shown in millimeters (mm) $H_2O$) is a non-linear relationship in which the pressure differential increases more rapidly as the filter(s) become more clogged, especially when the filters AF become about 80% clogged. According to an embodiment of the present development, a baseline setpoint SP1 is selected and implemented by the controller 170 to represent a pressure differential magnitude that indicates that the filter(s) AF are clogged sufficiently to require maintenance (replacement and/or cleaning) to remove the clogging contaminants. In one example, the baseline setpoint SP1 is selected to coincide with a filter clogging percentage of at least 90% such as 92% or 95%. Thus, when the controller 170 receives a pressure differential signal DX from the differential pressure sensor DP having a magnitude corresponding to a pressure differential across its positive and negative ports PX,NX that is approaching or equal to the baseline setpoint pressure differential such that the baseline setpoint SP1 is met or satisfied, the controller 170 implements additional actions as described below to predict or indicate the need for filter maintenance, i.e., cleaning or replacement of the filter(s) AF. It should be noted that although FIG. 4 uses mm $H_2O$ as the pressure differential units, any pressure units can alternatively be used such as pounds per square inch (PSI), inches (In.) $H_2O$, millibar (mb), and others.

The baseline setpoint SP1 is selected and stored in the controller 170 based upon standard operating condition parameters for the motor drive 100 such as a standard operational loading range (power output range), a standard ambient temperature range, a standard air quality range in terms of concentration of particulates or other contaminants, and a standard altitude range. The baseline setpoint SP1 is selected based upon the minimum airflow required to cool the motor drive 100 under rated (standard expected) operating conditions, wherein the minimum airflow required is converted to a nominal air pressure differential (vacuum pressure) within the enclosed cabinet space CS to establish the baseline setpoint SP1. With continuing reference to FIG. 4, it can be seen that the present development optionally further comprises adjusting the baseline setpoint SP1 to a higher or lower magnitude or level to obtain an adjusted setpoint SP2 based upon an actual variation in one or more of the operating condition parameters including: (i) an operational loading range or power output range (the expected heat generation inside the cabinet space CS); (ii) an ambient temperature range; (iii) an air quality range in terms of concentration of particulates or other contaminants; and (iv) altitude. The adjusted setpoint SP2 is stored in the controller 170 and used in place of the baseline setpoint SP2 to assess and predict clogging of the enclosure air filter(s) AF. More particularly, the pressure differential magnitude of the baseline setpoint SP1 is increased (adjusted upward) when operating conditions for the motor drive 100 are less harsh and allow for less cooling airflow through the cabinet space CS such as at least one of: (i) lower operating loads; (ii) lower ambient temperature; (iii) lower altitude where the fan(s) 160 move air more efficiently. In contrast, the pressure differential magnitude of the baseline setpoint SP1 is decreased (adjusted downward) when operating conditions for the motor drive are more harsh and require more cooling airflow through the cabinet space CS such as at least one of: (i) higher operating loads; (ii) higher ambient temperature; (iii) higher altitude where the fan(s) 160 move air less efficiently. Also, the baseline setpoint SP1 can be adjusted to obtain an adjusted setpoint SP2 based upon the ambient air quality in terms of concentration of particulate contaminants, with the baseline setpoint SP1 being adjusted downward when the motor drive 100 is subjected to harsh operating conditions of lower air quality (more particulates) since cleaning or replacement of the air filter(s) AF should be performed and/or predicted sooner as compared to rated (standard) operating conditions for the motor drive 100. It should be noted that the adjusted setpoint SP2 is not necessarily static but can be dynamic and adjusted over time (such as every time the controller 170 takes an air pressure differential reading from the differential pressure sensor DP) as the motor drive 100 is operated under different load conditions and ambient air temperature conditions as monitored by the controller 170.

Figure 5:
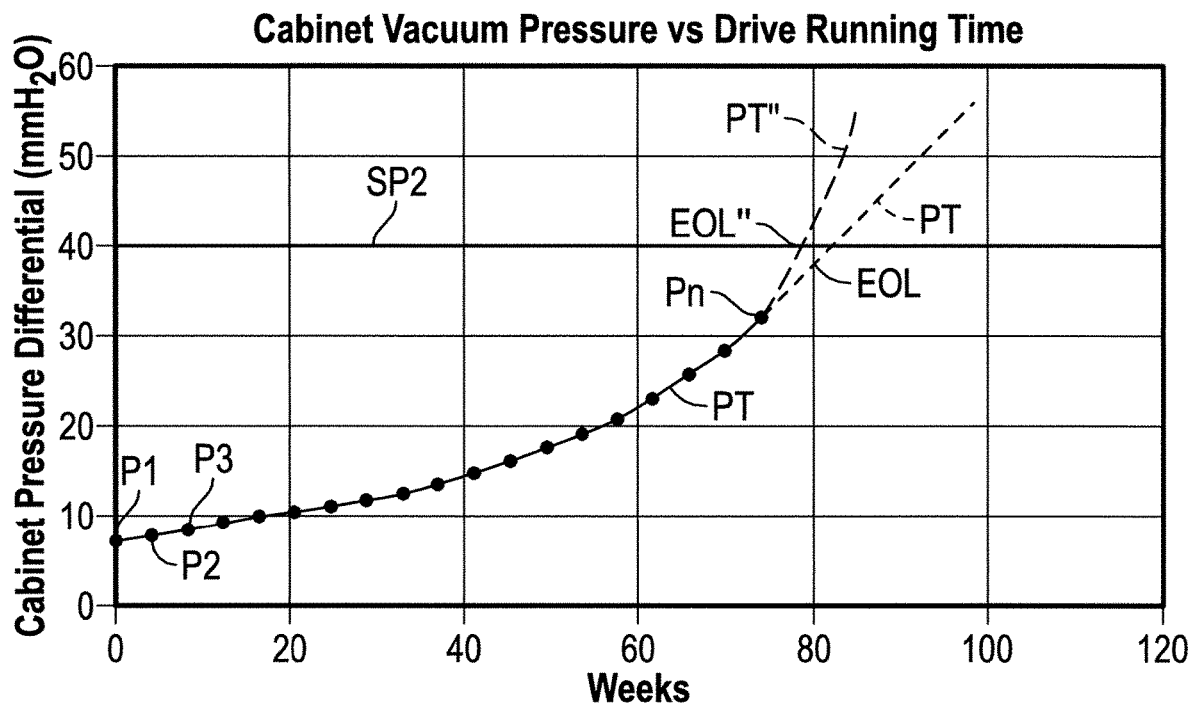
FIG. 5 is a graph that illustrates cabinet pressure differential (vacuum) pressure vs. time, showing in increase as air filter clogging increases.

FIG. 5 is a graph that illustrates the air pressure differential (mm H$_2$0) on the Y-axis vs. the number of weeks of operation time of the motor drive 100. The controller 170 implements the present predictive maintenance method for the enclosure air filter(s) AF by first determining a starting (initial) pressure differential value P1 inside the enclosed cabinet space CS with new (clean/unclogged) filters under the various fan running configurations. Here, it should be noted that the starting pressure value P1 can vary depending upon the number of fans 160 that are running at any given time. During operation of the motor drive 100, the controller 170 periodically samples and stores the air pressure differential signal DX output by the differential pressure sensor DP to obtain air pressure differential pressure readings or measurements. Over time, the controller 170 derives a series of air pressure differential values P2, P3, . . . Pn that record the change (increase) in the differential pressure over time due to clogging of the air filter(s) AF, and such air pressure differential values P2, P3, . . . Pn are saved and monitored by the controller 170. Each air pressure differential value P2, P3, . . . Pn can be derived from a single air pressure differential measurement taken from the air pressure differential pressure sensor DP or can be derived as an average or other mathematical combination of multiple (two or more) air pressure differential measurements taken by the controller 170 from the air pressure differential sensor DP over a select time period such as twenty-four hourly measurements taken over 1 day (24 hours), seven weekly measurements taken daily over one week (7 days), or other measurement frequency and time period. The interval at which differential air pressure measurements are sampled and used to derive the next air pressure differential value P2, P3, . . . Pn can be selected and varied based upon the ambient air quality, i.e., the expected or actual concentration of particulates in the ambient air, expected or actual operational load of the motor drive 100, expected or actual ambient air temperature, and/or other factors. The series of air pressure differential values P1, . . . , Pn (each derived from one or more air pressure differential measurements) define an actual air pressure differential trend PT as shown using a solid line which indicates actual air pressure differential values determined over a number of weeks (or other units such as days, hours, minutes, months, etc.) of operation of the motor drive 100.

The controller 170 periodically and continuously extrapolates the actual air pressure differential trend PT to derive a projected air pressure differential trend PT' (a projected filter clogging trend PT') as shown with a broken line. In one example, the controller 170 implements a linear extrapolation method to derive the projected air pressure differential trend PT'. Various extrapolation methods can alternatively or additionally be used without departing from the scope and intent of the present disclosure, such as a linear rate of change extrapolation or non-linear rate of change extrapolation of the actual pressure differential trend PT to derive a projected air pressure differential trend curve PT" as shown in FIG. 5. The controller 170 also derives a projected end of life parameter or value EOL for the air filter(s) AF based upon the expected intersection (equality) of the projected air pressure differential trend PT' (or the projected air pressure differential trend curve PT" as shown at EOL") with the baseline setpoint SP1 or the adjusted setpoint SP2 if the adjusted setpoint SP2 is used in place of the baseline setpoint SP1. The end-of-life parameter EOL can be expressed as a unit of time in the future from the present time such as a number of minutes, hours, days, weeks, months, etc. The controller 170 also determines an actual end of life event for the air filter(s) AF has occurred when the actual air pressure differential trend PT intersects (equals) the baseline setpoint SP1 or the adjusted setpoint SP2 if the adjusted setpoint SP2 is used in place of the baseline setpoint SP1. In either case, the projected end of life or actual end of life EOL is output by the controller 170 to a user of the motor drive 100 using any known output device(s) such as the Human/Machine Interface devices 106, wired or wireless network interface devices 108, and/or other output devices to produce a visual or audible warning to a human operator of the motor drive 100. The projected EOL event and/or timing of same can be displayed to the user, and warnings or alarms can be issued at a predetermined remaining running time before the air filters AF must be changed and/or at the time when the air filters AF must be changed immediately. In one embodiment, the controller 170 outputs a lower grade warning comprising a visual indication or indicia and/or audible output via the HMI 106 and/or network interface 108 for a predicted future end of filter life EOL event (with or without the expected future timing of same), and/or outputs a more severe warning comprising a visual indication or indicia and/or audible output via the HMI 106 and/or network interface 108 when the filter end of life EOL has been reached or has already occurred such that a user can assess the severity of the filter clogging based upon the type or severity of warning output by the controller 170.

In accordance with an embodiment of the present development, it has been found advantageous to implement the method described above using fan airflow data rather than differential pressure data. The system S utilizes published airflow versus pressure curves for the fan(s) 160 to convert the measured differential pressure DP across the fan (fan static pressure) to derive airflow data in terms of cubic feet per minute (CFM) or other volumetric units. In such embodiment, the differential pressure sensor DP can be operatively connected such that its negative port NX is in fluid communication with a sensing location that is within or otherwise adjacent the fan inlet (FI) and its positive port PX located on an opposite side of the fan, downstream in terms of the airflow direction, in fluid communication with a reference location that is within or otherwise adjacent the fan outlet FO of the fan 160 being monitored to measure the air pressure differential across the fan 160. The airflow volume derived based upon the measured air pressure differential across the fan 160 using known airflow versus pressure relationships for a particular fan 160 will depend on the number of fans 160 that are active in that the published airflow data for a single fan 160 is multiplied by the number of active fans moving air. For every fan 160, the relationship of airflow to static pressure at a select revolutions per minute speed of the fan 160 (the "fan curve") is known and can be defined in a lookup table LUT (FIG. 3) or other memory data structure implemented by the controller 170 or other part of the system S so that the controller 170 can convert the sensed differential pressures DP across the fan 160 to airflow volume induced by the fan(s) 160 for a particular fan model. In one embodiment, each particular fan curve of interest for the fan(s) 160 as operated at one or more RPM speeds is approximated in a lookup table using multiple (e.g., 20 or more) coordinate pairs of input (pressure differential) and output (airflow volume) data points, with linear interpolation used for intermediate data points between the coordinate pairs to obtain an error of <1% relative to the continuous fan curve. Each set of coordinate pairs stored in the lookup table LUT approximates the fan curve for a given fan RPM speed. The published and stored static pressure vs. airflow values are typically based upon ideal conditions such as sea level and 20° C. or similar in so called "standard air." The controller 170 can use the altitude data and temperature data described above to adjust the airflow data derived from the lookup table LUT to derive adjusted airflow data to compensate for the reduced mass of air that will be moved at higher elevations and/or higher temperatures.

Figure 6:
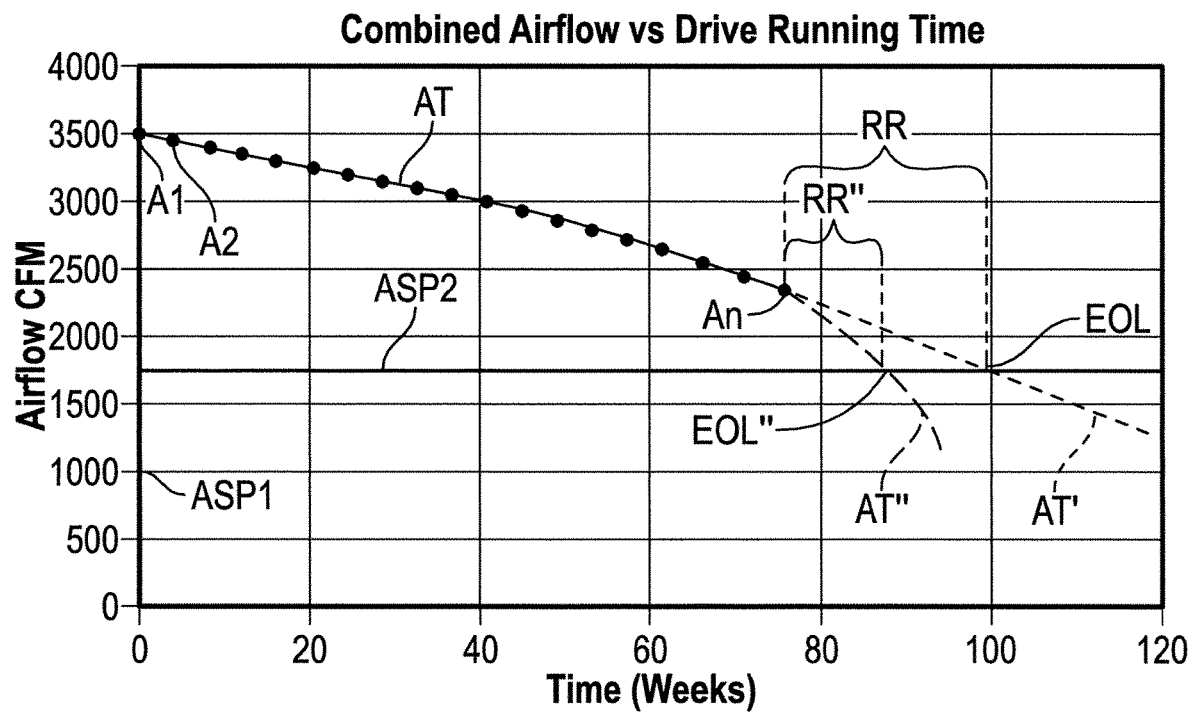
FIG. 6 is a graph that illustrates cabinet airflow over time showing a decrease as air filter clogging increases over time.

FIG. 6 graphically shows that airflow volume through the cabinet space S (shown as CFM on the Y-axis) as induced by the fan(s) 160 decreases over time (shown in weeks on the X-axis) as the air filter(s) AF of the enclosure cabinet C become clogged with dust and other contaminants. As noted above, the airflow volume is derived by the controller 170 based upon the air pressure differential data DX received from the differential pressure sensor DP using the fan curve as stored in the lookup table LUT. As noted, the controller 170 can adjust the derived airflow volume based upon the temperature data received from the temperature sensor T and based upon altitude, with less mass of air being moved by the fan(s) 160 as temperature and/or altitude increase and the air becomes less dense, in which case the initial derived airflow volume magnitude is adjusted downward to compensate for the fact that less mass of air is being moved than expected in standard conditions.

A baseline airflow setpoint ASP1 is also selected and implemented by the controller 170 to represent an airflow magnitude that indicates that the filter(s) AF are clogged sufficiently to require maintenance (replacement and/or cleaning) to remove the clogging contaminants. In one example, the baseline airflow setpoint SP1 is selected to coincide with a filter clogging percentage of at least 80% such as 85% or 90%. Thus, when the controller 170 derives an airflow volume magnitude value based upon the air pressure differential signal DX that equals or is less than the baseline airflow setpoint ASP1 such that the setpoint is met or satisfied, the controller 170 implements additional actions as described below to predict or indicate the need for filter maintenance, i.e., cleaning or replacement of the filter(s) AF.

The baseline airflow setpoint ASP1 is selected and stored in the controller 170 based upon standard operating condition parameters for the motor drive 100 such as a standard operational loading range (power output range), a standard ambient temperature range, a standard air quality range in terms of concentration of particulates or other contaminants, and a standard altitude range. A baseline airflow setpoint ASP1 is selected based upon the minimum airflow required to cool the motor drive 100 under rated (standard expected) operating conditions. The baseline airflow setpoint ASP1 is optionally adjusted by the controller 170 to a higher or lower magnitude or level to obtain an adjusted airflow setpoint ASP2 based upon an actual variation in one or more of the operating condition parameters including: (i) an operational loading range (power output range); (ii) an ambient temperature range; (iii) an air quality range in term is of concentration of particulates or other contaminants; and (iv) altitude. The adjusted airflow setpoint ASP2 can be stored in the controller 170 and used in place of the baseline airflow setpoint ASP1 to assess and predict clogging of the cabinet air filter(s) AF. More particularly, the airflow magnitude of the baseline airflow setpoint ASP1 is decreased (adjusted downward) to obtain the adjusted airflow setpoint ASP2 when less harsh operating conditions for the motor drive 100 allow for less cooling airflow through the cabinet space CS such as at least one of: (i) lower operating loads; (ii) lower ambient temperature; (iii) lower altitude where the fan(s) 160 move air more efficiently. In contrast, the magnitude of the baseline airflow setpoint ASP1 is increased (adjusted upward) to obtain the adjusted airflow setpoint ASP2 when more harsh operating conditions for the motor drive 100 require more cooling airflow through the cabinet space CS such as at least one of: (i) higher operating loads; (ii) higher ambient temperature; (iii) higher altitude where the fan(s) 160 move air less efficiently. Additionally, the baseline airflow setpoint ASP1 can be adjusted to obtain a new adjusted airflow setpoint ASP2 based upon the ambient air quality in terms of concentration of particulate contaminants, with the baseline airflow setpoint ASP1 being adjusted upward (resulting in more frequent replacement of the filters AF) when the motor drive 100 is subjected to operating conditions have a lower air quality (more particulates) since cleaning or replacement of the air filter(s) AF should be performed and/or predicted sooner as compared to rated (standard) operating conditions for the motor drive 100. It should also be noted that the adjusted airflow setpoint ASP2 is not necessarily static but can be dynamic and is adjusted over time (such as every time the controller 170 derives an airflow magnitude reading/sample based upon the differential pressure data DX) as the motor drive 100 is operated under different load conditions and ambient air temperature conditions as monitored by the controller 170.

The controller 170 implements a predictive maintenance method for the enclosure air filter(s) AF by first determining a starting (initial) airflow A1 inside the enclosed cabinet space CS with new (clean/unclogged) air filters AF. During operation of the motor drive 100, the controller 170 periodically calculates new airflow values A2, A3, ... An based upon the differential pressure sensor data DX as the differential pressure increases over time (and airflow decreases over time) due to clogging of the air filters AF. The airflow values A1, ... An are saved and monitored by the controller 170. The interval at which differential air pressures are sampled and used to derive airflow can be selected and varied based upon the ambient air quality, i.e., the expected or actual concentration of particulates in the ambient air. Each airflow value A1, ... An can be based upon a single air pressure differential measurement or a minimum number of multiple measurements averaged over a select time period such as the average of 24 measurements taken once per hour over a day, 7 measurements taken once per day over one week, or some other average. The series of airflow values A1, ..., An define an actual airflow trend AT over a number of weeks (or other units such as days, hours, minutes, months, etc.) of operation of the motor drive 100. The controller 170 periodically extrapolates the airflow trend AT to derive a projected airflow trend AT' as shown by a broken line. In one example, the controller 170 implements a linear extrapolation method to derive the projected airflow trend AT'. Various extrapolation methods can alternatively or additionally be used without departing from the scope and intent of the present disclosure, such as a linear rate of change extrapolation or non-linear rate of change extrapolation of the actual airflow trend AT to derive a curved projected airflow trend curve AT" as shown in FIG. 6. The controller 170 also derives a projected end of life parameter EOL for the air filter(s) AF based upon the expected intersection of the projected airflow trend AT' (or the projected airflow trend curve AT" as shown at EOL") with the baseline setpoint ASP1 or the adjusted airflow setpoint ASP2 if the adjusted setpoint ASP2 is used in place of the baseline airflow setpoint ASP1. The end-of-life event parameter EOL can be expressed as a unit of time in the future from the present time such as a number of minutes, hours, days, weeks, months, etc., shown as "Remaining Runtime" RR in FIG. 6 (also shown at RR" for the projected airflow trend AT"). In this sense, the end of life event EOL or EOL" can be used to determine a future time when air filter maintenance is predicted to be required. The controller 170 also determines an actual end of life event for the air filter(s) AF has occurred when the airflow trend AT intersects (equals) the baseline airflow setpoint ASP1 or intersects (equals) the adjusted airflow setpoint ASP2 if the adjusted airflow setpoint ASP2 is used in place of the baseline airflow setpoint ASP1 which indicates that the setpoint has been met or satisfied. In either case, the projected end of life EOL event or actual end of life EOL event is output by the controller 170 to a user of the motor drive using any known output device(s) such as the Human/Machine Interface (HMI) devices 106, wired or wireless network interface devices 108, and/or other output devices. The projected EOL time in terms of a future date or a number of hours, days, or other time units in the future or in another format can be displayed to the user, and audible and/or visual alarms can be initiated by the controller 170 at a predetermined remaining running time RR before the filters AF must be cleaned or changed and/or at the actual time when the filters AF must be cleaned or changed. The remaining running time RR is equal to the X-axis distance (time) between the present time and the time of the expected intersection of the projected airflow trend AT' with the baseline airflow setpoint ASP1 or adjusted airflow setpoint ASP2. In one embodiment, the controller outputs a lower grade visual or audible warning for a predicted future end of filter life EOL event and outputs a more severe visual or audible warning when the filter end of life EOL has been reached such that a user can assess the severity of filter clogging based upon the severity of the warning output by the controller 170.

In the case where a cabinet C includes multiple fans 160, it can sometimes be desirable to adjust the differential air pressure data DX to compensate for variations that can occur based upon the location (across which fan 160) where the air pressure is sensed by the differential pressure sensor DP. As noted, in some embodiments, the negative port NX is located in or is connected via tubing to the fan inlet FI of one of the fans 160, which is shown as a primary fan 160' in FIG. 3. The measured/sensed differential air pressure data DX can be adjusted when the primary fan 160' is not active (not moving air) to compensate for the fact that when the primary fan 160' is not active, the pressure differential measured by the differential pressure sensor DP across the inactive primary fan 160' will effectively be the vacuum pressure within the cabinet space CS (the difference in air pressure between the internal cabinet space CS and the ambient atmosphere outside the drive cabinet C), which will be a lower value (less differential air pressure) than the differential air pressure that would be sensed if the primary fan 160' was active. In particular, when the primary fan 160' is not running, the air pressure differential sensed across the fan by the sensor DP is reduced by a fan compensation amount or value $P_{hood}$. The magnitude of the compensation amount/value of $P_{hood}$ can be determined for the drive cabinet C based upon sensing and comparing the air pressure differential DX using the sensor DP when the primary fan 160' is active (moving air) and when the primary fan 160' is inactive (not moving air) while the other fans(s) 160 are active. The difference between the sensed air pressure when the primary fan 160' is active (higher air pressure differential) as compared to when the primary fan 160' is inactive (lower air pressure differential) is equal to the fan compensation value $P_{hood}$.

According to one embodiment of the present development, the differential air pressure DX as sensed by the sensor DP is adjusted upward by an amount equal to the compensation value $P_{hood}$ to obtain an adjusted differential air pressure value DX' if the differential air pressure DX is measured when the primary fan 160' is inactive such that DX'=DX+$P_{hood}$. In such case, the adjusted differential air pressure value DX' is used by the controller 170 to derive the air pressure differential trends PT,PT' and also the airflow trends AT,AT' described above.

Figure 7A:
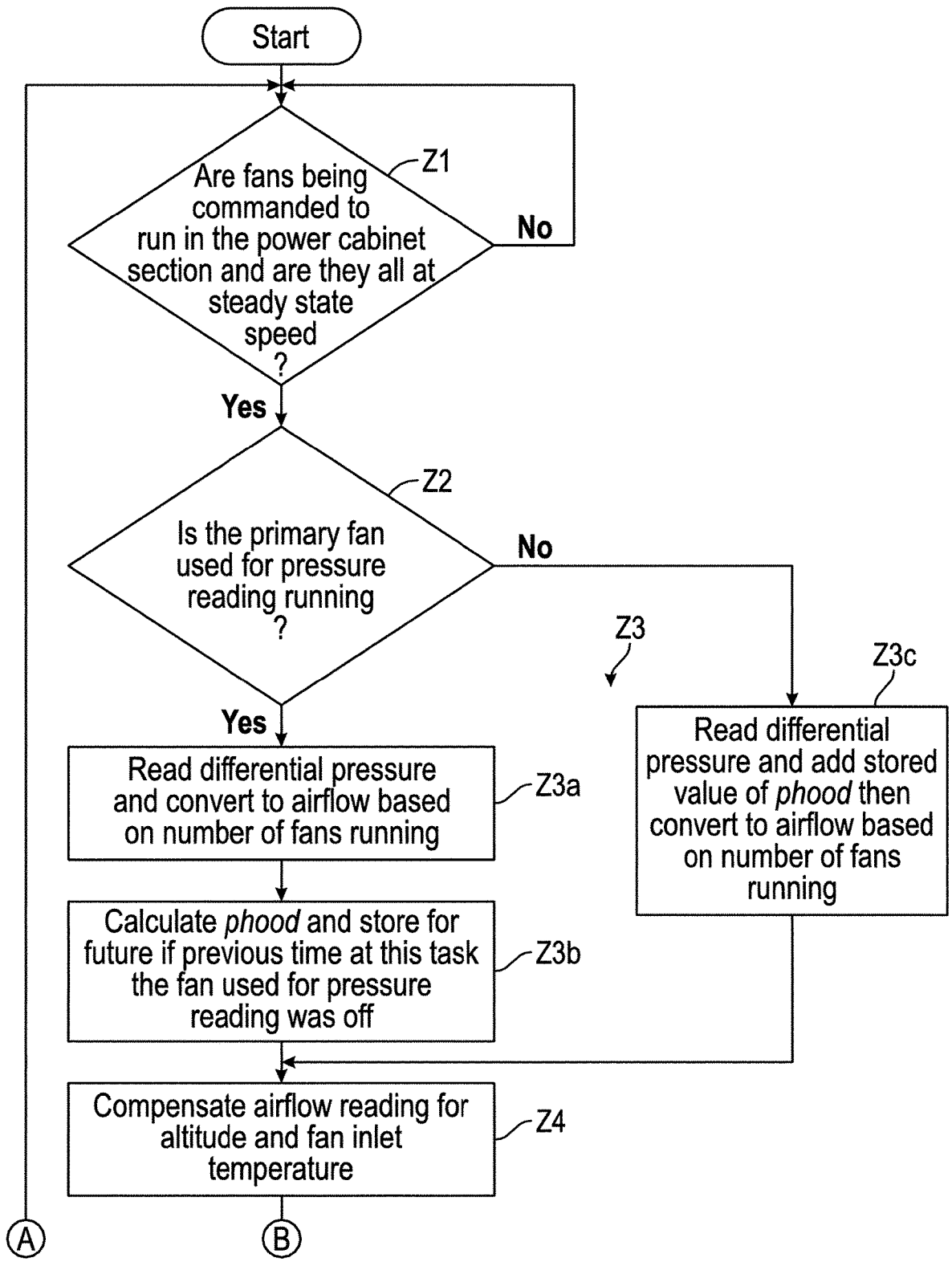
FIGS. 7A & 7B together provide a flow chart that discloses one example of an airflow health predictive maintenance system and method in accordance with an embodiment of the present development.
Figure 7B:
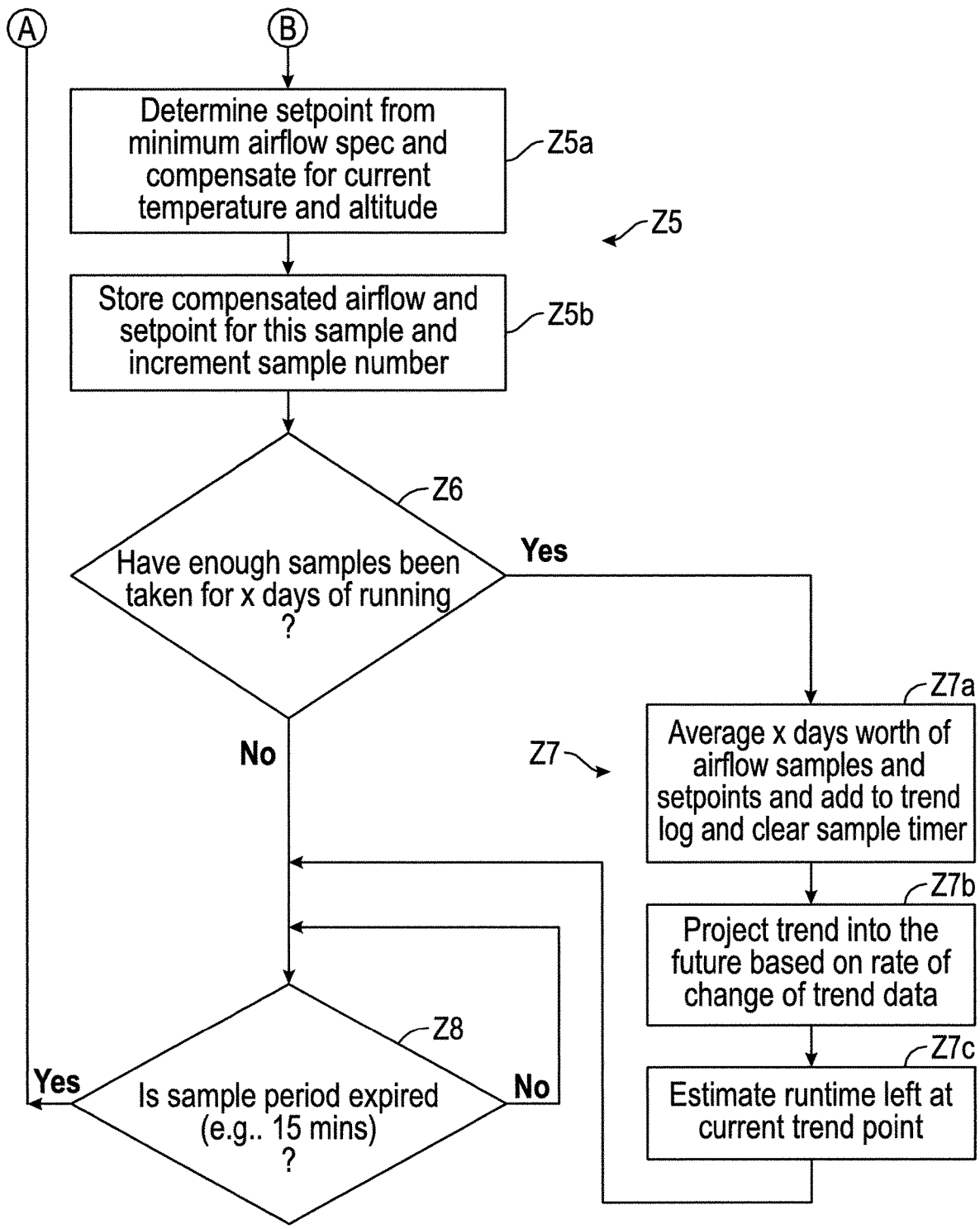

FIGS. 7A & 7B (collectively FIG. 7) provide a flow chart that illustrates an example of an airflow health predictive maintenance system and method in accordance with an embodiment of the present development. The method can be implemented by the controller 170 or another electronic microprocessor-based system. A step Z1 determines if one or more of the fans 160 are operative to cool the system 100. If not, step Z1 is repeated. If yes, a step Z2 determines if the primary fan 160' across which the differential pressure sensor DP is installed is active. If the step Z2 determined that the primary fan 160' is active, airflow magnitude is derived from the lookup table LUT in a step Z3a based upon the pressure differential data DX and the number of fans 160 that are active. Also, in a step Z3b, the pressure differential compensation value $P_{hood}$ is also calculated and stored as described above if stored differential air pressure data DX is available from previous readings when the primary fan 160' was not active. If the step Z2 determined that the primary fan 160' is not active, a step Z3c derives airflow magnitude from the lookup table LUT based upon the adjusted air pressure differential data DX' (where DX'=DX+$P_{hood}$ as described above) and also based upon the number of fans 160 that are active to move air.

Following step Z3 (both steps Z3a and Z3b or only step Z3c, as the case may be), a step Z4 compensates the airflow magnitude derived in step Z3 based upon the altitude of the motor drive 100 and also based upon the temperature of the air entering the fan inlet FI of at least one of the fans 160 given that the mass of air moved by the fans 160 will decrease at higher altitude or higher temperatures meaning that the airflow magnitude derived in step Z3 based upon standard air will be adjusted (decreased) in step Z4 depending upon an elevated altitude and/or elevated temperature to obtain a true airflow magnitude.

A step Z5 including steps Z5a and Z5b is implemented to select the baseline airflow setpoint ASP1 and to adjust the baseline airflow setpoint ASP1 to obtain the adjusted airflow setpoint ASP2. In particular, the step Z5a is implemented to determine the baseline airflow setpoint ASP1 and adjust same to derive the adjusted airflow setpoint ASP2 based upon temperature and altitude. In a step Z5b, the adjusted airflow setpoint ASP2 is stored in memory and a counter is incremented to track the number of airflow measurements obtained. The step Z5 can include other compensation such as adjustment of the baseline airflow setpoint ASP1 based upon operational loading of the drive 100.

Following step Z5, a step Z6 determines if the number of airflow measurements is equal to or greater than a required minimum run time (such as a minimum number of measurement samples taken over a select number of one or more days X) and, if yes, a step Z7 is carried out including steps Z7a, Z7b, and Z7c to:

Z7a—average the airflow measurement data to obtain an airflow value A1, . . . , An and also to average all of the adjusted airflow setpoints ASP2 respectively associated with the airflow sample data to obtain the current adjusted airflow setpoint ASP2;

Z7b—project (extrapolate) the updated airflow trend AT to derive the projected airflow trend AT' using linear, linear rate of change, non-linear rate of change, or other extrapolation methods as described above in relation to FIG. 6 based upon real world data; and, Z7c—find the intersection of the projected airflow trend AT' with the adjusted airflow setpoint ASP2 to find the end of life event EOL and to estimate the remaining runtime RR as the time between the current time and the end of life event EOL.

Alternatively, if the step Z6 determines that more airflow magnitude measurements are required before averaging to calculate the next airflow value A1, . . . , An, a delay timer step Z8 is implemented to delay a select amount of time (e.g., 15 minutes) before control then returns to step Z1 to repeat the process to obtain another airflow magnitude measurement.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An airflow health predictive maintenance system for a motor drive, said system comprising:
   a differential pressure sensor that senses an air pressure differential between a sensing location within an enclosed cabinet space of the motor drive and a reference location external to the enclosed cabinet space, wherein the air pressure differential represents a vacuum pressure established within the enclosed cabinet space;
   an electronic control system configured to:
     select a setpoint that indicates that airflow through the enclosed cabinet space has reached a value associated with a need to perform maintenance on an air filter configured to filter air flowing into the enclosed cabinet space;
     obtain air pressure differential measurements periodically from said differential pressure sensor and generate an actual trend comprising a series of values, wherein each of said values of said actual trend is derived from one or more of said air pressure differential measurements;
     project said actual trend to derive a projected trend based upon said series of values of said actual trend; and
     compare said projected trend to said setpoint to predict an end of life event used to determine a time when air filter maintenance is predicted to be required, wherein said end of life event is based upon a predicted intersection of said projected trend with said setpoint.

2. The airflow health predictive maintenance system as set forth in claim 1, wherein said system comprises at least one fan for inducing said airflow.

3. The airflow health predictive maintenance system as set forth in claim 2, wherein:
   said setpoint comprises an air pressure differential setpoint defined in terms of magnitude of air pressure differential between the enclosed cabinet space and the reference location; and
   said actual trend comprises an actual air pressure differential trend for which said series of values comprise a series of air pressure differential values derived from said air pressure differential measurements.

4. The airflow health predictive maintenance system as set forth in claim 3, wherein said electronic control system is further configured to output a warning related to said end of life event to at least one of: (i) a human machine interface; and (ii) a network interface.

5. The airflow health predictive maintenance system as set forth in claim 4, wherein said electronic control system is further configured to adjust the air pressure differential setpoint based upon at least one of: (i) operational loading associated with the motor drive; (ii) temperature of an ambient atmosphere surrounding the motor drive; (iii) air quality in terms of concentration of particulates or other contaminants of the ambient atmosphere; and (iv) altitude of the motor drive.

6. The airflow health predictive maintenance system as set forth in claim 1, further comprising an absolute pressure sensor for sensing an atmospheric pressure of an ambient atmosphere surrounding the motor drive.

7. The airflow health predictive maintenance system as set forth in claim 1, further comprising:
   at least one fan that induces said airflow through the enclosed cabinet space by moving air from a fan inlet of said at least one fan to a fan outlet of said at least one fan, wherein said sensing location and said reference location are located on opposite sides of said at least one fan adjacent said fan inlet and said fan outlet, respectively, such that said air pressure differential measurements are taken across the at least one fan.

8. The airflow health predictive maintenance system as set forth in claim 7, wherein:
   said setpoint comprises an airflow volume setpoint defined in terms of airflow volume through the enclosed cabinet space; and
   said series of values of said actual trend comprises a series of airflow values that define an actual airflow trend, wherein each of said series of airflow values is derived from one or more of said air pressure differential measurements.

9. The airflow health predictive maintenance system as set forth in claim 8, wherein said electronic control system is further configured to:
   compare said projected trend to said setpoint to determine said end of life event when said projected trend equals said airflow volume setpoint.

10. The airflow health predictive maintenance system as set forth in claim 9, wherein said electronic control system is configured to output a warning that provides information about expected timing of said end of life event to at least one of: (i) a human machine interface; and (ii) a network interface.

11. The airflow health predictive maintenance system as set forth in claim 10, wherein said electronic control system is further configured to adjust the airflow volume setpoint based upon at least one of: (i) operational loading associated with the motor drive; (ii) temperature of an ambient atmosphere surrounding the motor drive; (iii) air quality in terms of concentration of particulates or other contaminants of the ambient atmosphere; and (iv) altitude of the motor drive.

12. The airflow health predictive maintenance system as set forth in claim 11, wherein said at least one fan comprises multiple fans of which one of said multiple fans is a primary fan, and wherein said differential pressure sensor senses said air pressure differential measurements across said primary fan between said fan inlet of said primary fan and said fan outlet of said primary fan.

13. The airflow health predictive maintenance system as set forth in claim 12, wherein said electronic control system increases said air pressure differential measurements by a select compensation amount when said air pressure differential measurements are taken when said primary fan is inactive and at least one other fan of said multiple fans is active.

14. The airflow health predictive maintenance system as set forth in claim 13, wherein said select compensation amount is related to a difference in the air pressure differential sensed by said differential pressure sensor when said primary fan is active as compared to when said primary fan is inactive.

15. The airflow health predictive maintenance system as set forth in claim 7, wherein said at least one fan comprises multiple fans of which one of said multiple fans is a primary fan, and wherein said differential pressure sensor senses said air pressure differential measurements across said primary fan between said fan inlet of said primary fan and said fan outlet of said primary fan.

16. A method for airflow health predictive maintenance for a motor drive, said method comprising:
   operating a fan to induce airflow through an enclosed space of a cabinet of the motor drive, wherein said airflow enters the enclosed space through at least one air filter;
   sensing, by a differential pressure sensor, an air pressure differential created by said fan between a sensing location in communication with said enclosed space and a reference location external to the enclosed space to obtain an air pressure differential measurement that represents a vacuum pressure established within the enclosed space; and
   at least one of:
      (i) comparing said air pressure differential measurement to an air pressure differential setpoint and predicting when maintenance of said at least one air filter will be required; and
      (ii) deriving a volume of said airflow based upon said air pressure differential measurement, comparing said volume of said airflow to an airflow volume setpoint to predict when maintenance of said at least one air filter will be required.

17. The method for airflow health predictive maintenance as set forth in claim 16, said method further comprising:
   generating an actual trend of air pressure differential values where each of said air pressure differential values is derived from at least one said air pressure differential measurement;
   extrapolating said actual trend of air pressure differential values to derive a predicted trend of air pressure differential values; and
   comparing said predicted trend of air pressure differential values to said air pressure differential setpoint to predict an end of life event for said at least one air filter.

18. The method for airflow health predictive maintenance as set forth in claim 17, further comprising:
   periodically dynamically adjusting said air pressure differential setpoint based upon at least one of: (i) operational loading of the motor drive; (ii) ambient temperature relative surrounding the motor drive; and (iii) altitude of the motor drive.

19. The method for airflow health predictive maintenance as set forth in claim 16, said method further comprising:
   generating an actual trend of airflow volume values where each of said airflow volume values is derived from at least one said air pressure differential measurement;
   extrapolating said actual trend of airflow volume values to derive a predicted trend of airflow volume; and
   comparing said predicted trend of airflow volume to said airflow volume setpoint to predict an end of life event for said at least one air filter.

20. The method for airflow health predictive maintenance as set forth in claim 19, further comprising:
   periodically dynamically adjusting said airflow volume setpoint based upon at least one of:
   (i) operational loading of the motor drive; (ii) ambient temperature relative surrounding the motor drive; and (iii) altitude of the motor drive.

* * * * *